United States Patent [19]

Hirayama et al.

[11] Patent Number: 5,274,649
[45] Date of Patent: Dec. 28, 1993

[54] WAVELENGTH-TUNABLE DISTRIBUTED-FEEDBACK SEMICONDUCTOR LASER DEVICE

[75] Inventors: Yuzo Hirayama, Yokohama; Masaaki Onomura, Tokyo, both of Japan

[73] Assignee: Kabushiki Kaisha Toshiba, Kawasaki, Japan

[21] Appl. No.: 795,831

[22] Filed: Nov. 21, 1991

[30] Foreign Application Priority Data

Nov. 21, 1990 [JP] Japan ................. 2-314365

[51] Int. Cl.$^5$ .................. H01S 3/10; H01S 3/19
[52] U.S. Cl. .................... 372/20; 372/46; 372/50; 372/96
[58] Field of Search ........... 372/20, 45, 46, 50, 372/96

[56] References Cited

U.S. PATENT DOCUMENTS 5,177,758  1/1993  Oka et al. ................. 372/50

FOREIGN PATENT DOCUMENTS 0402907  12/1990  European Pat. Off. .

OTHER PUBLICATIONS

Applied Physics Letters, vol. 57, No. 20, Nov. 12, 1990, pp. 2068-2070, K. Y. Lau, "Frequency Modulation and Linewidth of Gain-Levered Two-Section Single Quantum Well Lasers".
Proceedings of the Conference on Lasers and Electrooptics (CLEO), May 1990, pp. 667-668, M. C. Wu, et al., "Gain-Levering Enhanced Continuous Wavelength Tuning (6.1 NM) in Two-Section Strained Multi-Quantum Well DFB Lasers".
Patent Abstracts of Japan, vol. 13, No. 103 (E-725), Mar. 10, 1989, & JP-A-63-276289, Nov. 14, 1988, T. Matsui, et al., "Semiconductor Laser and Using Method Thereof".
Journal of Lightwave Technology, vol. LT-5, No. 4, Apr. 1987, pp. 516-522, Y. Yoshikuni, et al., "Multielectrode Distributed Feedback Laser for Pure Frequency Modulation and Chirping Suppressed Amplitude Modulation".
"Broad Wavelength Tunability in Gain-Levered Quantum Well Semiconductor Lasers", Appl. Phys. Lett. 57(25), Dec. 17, 1990, pp. 2632-2634.

Primary Examiner—James W. Davie
Attorney, Agent, or Firm—Oblon, Spivak, McClelland, Maier & Neustadt

[57] ABSTRACT

An electronically wavelength-tunable distributed-feedback quantum well semiconductor laser includes a semiconductor substrate, an optical waveguide layer on the substrate, and a multiple quantum well structure section arranged on the optical waveguide layer and including first and second semiconductor layers which are alternately laminated on each other. The multiple quantum well structure section change regionally in the lamination number of the first and second layers, thereby defining a series of active regions with different gain versus carrier characteristics. A plurality of electrodes are formed on the upper portion of the multiple quantum well structure section positionally in association with the series of the activated regions.

7 Claims, 3 Drawing Sheets

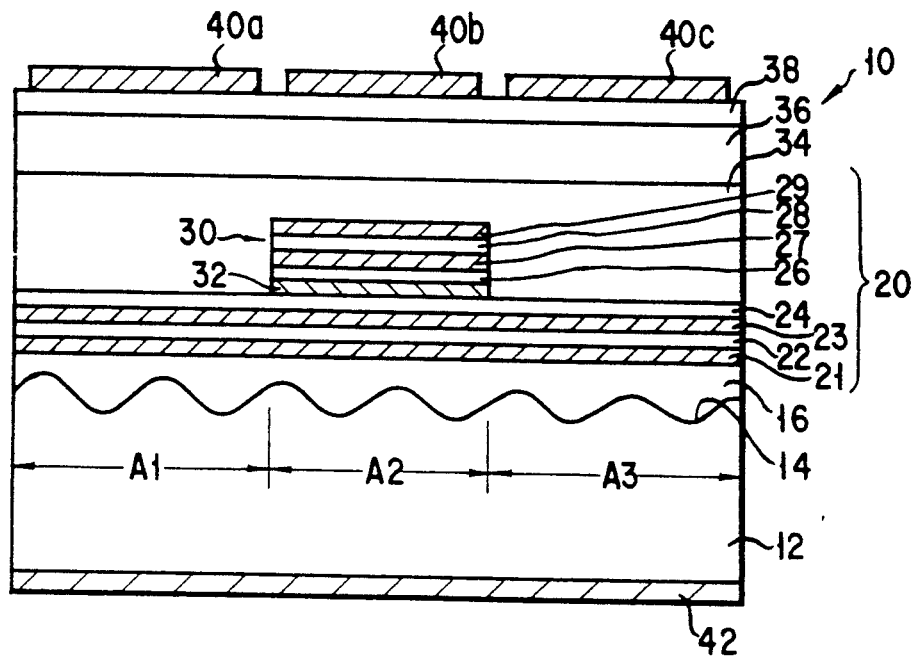
F I G. 1
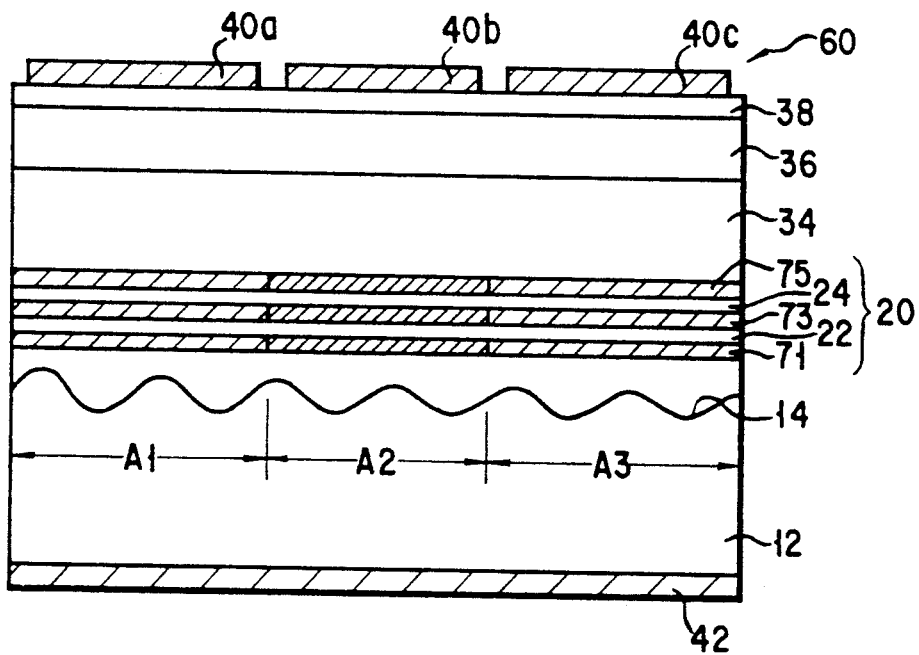
F I G. 5

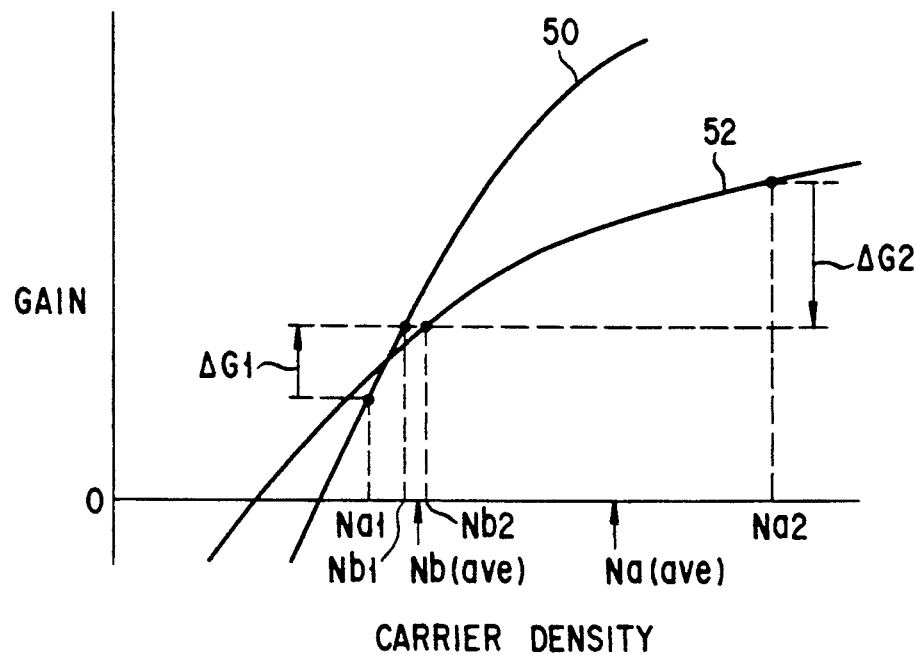
F I G. 3

WAVELENGTH-TUNABLE DISTRIBUTED-FEEDBACK SEMICONDUCTOR LASER DEVICE

BACKGROUND OF THE INVENTION

1. Field of the Invention

This invention relates generally to solid-state light-emitting devices, and more particularly to a semiconductor laser that is electronically tunable in the oscillation wavelength thereof, and a process of forming the same.

2. Description of the Related Art

As the complexity of communication processing architecture has increased, it has become more important to develop coherent optical communication systems of larger capacity and of longer effective communication distance. In particular, a coherent optical communication system employing a frequency multiplexed modulation scheme is very promising at present due to its significant increase in the amount of transmittable information.

In the frequency-multiplexed optical communication system, the receiver side (e.g., a subscriber terminal) is provided with a semiconductor laser as a light emitting-/receiving device for selecting a desired communication channel. This laser is a light-emitting device which can change its own oscillation wavelength. In selecting the desired communication channel on the receiver side, the laser is electrically driven to vary the lasing wavelength to tune the oscillation frequency to that of the desired channel. Obviously, widening the wavelength tuning range may cause the tunable frequency band to be expanded desirably. However, conventional wavelength-tunable semiconductor lasers cannot fulfill the following two conflicting requirements: (1) widening the wavelength tuning range, and (2) narrowing the spectral linewidth of oscillation at the varied wavelength.

Conventionally, a multi-electrode distributed Bragg reflector (DBR) semiconductor laser is known which can vary the Bragg wavelength continuously, while the continuous variation amount is relatively large. The resultant linewidth however expands undesirably to range from 10 to 20 MHz in tuning the wavelength, making it impossible to attain the desired narrow linewidth for optical communication systems. The expansion of linewidth originates from the occurrence of carrier noise in the DBR region.

A multi-electrode distributed feedback (DFB) semiconductor laser is also known which has a good oscillating linewidth, and is thus a very promising light-emitting device for use in coherent optical transmission systems. Unfortunately, however, the laser suffers from a serious problem of an inherently narrow wavelength tuning range, as will be described below.

The laser has been described in M.C. Wu et al., "CLEO '90," at p. 667, wherein it has an active region with a uniform quantum well structure. Two electrodes are provided to inject current carriers into the active region. With this arrangement, the gain versus carrier density characteristic is non-linear. A required gain for oscillation may be obtained by selecting suitable regions of different differential gains and by optimizing the amount of carrier injection from each electrode. In other words, as the total carrier density is variable, it is possible to cause the refractive index and frequency (wavelength), which vary linearly to the carrier density, to be variable. In this case, the selectable differential-gain region is limited only to the region included within a specific range wherein an operating point is available on a single gain versus carrier density characteristic curve. This results in that the wavelength tuning range remains as little as 6 nanometers (nm) or less.

SUMMARY OF THE INVENTION

It is therefore an object of this invention to provide a new and improved semiconductor laser device that is excellent in its wavelength tunability.

It is another object of the invention to provide a new and improved semiconductor laser device that has a broad oscillation-wavelength tuning range while maintaining a narrow spectrum linewidth, and a process of forming the same.

In accordance with the above objects, this invention is addressed to a specific semiconductor laser device, which comprises a diffraction grating section arranged on or above a substrate for determining a Bragg wavelength for an oscillating light, an active region having a differential gain that is spatially variable, and an electrode section associated with the active region, for selectively supplying different currents to the active region and changing the oscillation frequency of the oscillating light in response to injection of selected current carriers. This electrode section includes multiple electrode layers arranged in accordance with a spatial change in the differential gain of the active region.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a schematic main cross-section (not drawn to scale of a wavelength-tunable semiconductor laser according to one embodiment of the invention.

FIG. 3 is a graph showing gain versus carrier density characteristics in different regions in the longitudinal direction of a resonator in the laser in FIG. 1.

FIG. 5 is a schematic cross-section (not drawn to scale) of a wavelength-tunable semiconductor laser according to another embodiment of the invention.

DETAILED DESCRIPTION OF THE PREFERRED EMBODIMENTS

Figure 2A:
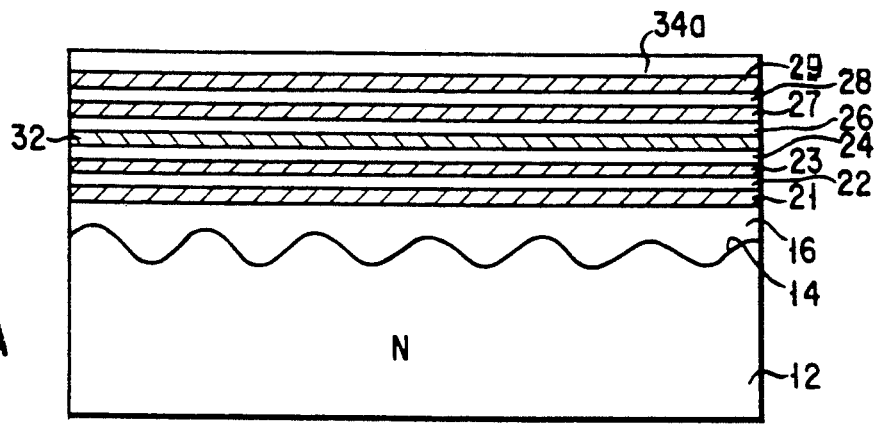
FIGS. 2A, 2B and 2C illustrate in schematic cross-section, some of the major steps in the process of fabricating the laser of FIG. 1.

Referring to FIG. 1, a wavelength-tunable distributed-feedback (DFB) quantum-well semiconductor laser according to one preferred embodiment of the invention is generally designated by numeral 10. The laser 10 has a semiconductive substrate 12, which is made from N-type indium phosphide (InP) material. The N-type InP substrate 12 has a top surface where a first-order diffraction grating 14 is formed. Grating 14 is formed so that the phase thereof is shifted by $\lambda/4$ in the central region of an internal resonator in laser 10. The periodically "corrugated" configuration (grooves) of grating 14 is selected to be transverse to the direction <011> of the axis of active region.

As shown in FIG. 1, a semiconductive layer 16 is arranged on the substrate 12 as an optical waveguide layer. Layer 16 is made from a selected semiconductor mixed crystal, typically indium gallium arsenide (InGaAs). A multi-layered (multiple) quantum-well structure (QWS) section 20 is arranged on layer 16. QWS section 20 consists of two kinds of layers that are laminated alternately. Section 20 may be an alternate lamination of InGaAs well layers (hatched in FIG. 1) 21, 23, 27, 29 and InGaAs barrier layers 22, 24, 26, 28.

Very importantly, the QWS section 20 locally differs in the lamination number in regions A1, A2, A3 along the longitudinal direction of an internal resonator in laser 10. Four pairs of well/barrier layers are laminated in the central region A2, while two pairs of well/barrier layers are laminated in the peripheral regions A1, A3 on the respective sides of region A2. To accomplish such a locally different lamination structure, section 20 has a protruding portion 30 in central region A2. Protruding portion 30 is an alternate lamination of InGaAs well layers 27, 29 and InGaAsP barrier layers 26, 28. The lower lamination structure of the well/barrier layers includes InGaAs well layers 21, 23, which longitudinally extend throughout the resonator, and InGaAsP barrier layers 22, 24, as shown in FIG. 1. An InP layer 32 covers the central top surface of the lower well/barrier lamination structure; this layer is an etching-stopper.

A second optical waveguide layer 30 overlies the protruding portion 30 of the QWS section 20. This layer may be made from InGaAsP. On the flat top surface of layer 34, a P-type InP cladding layer 36 and an InGaAs contact layer 38 are sequentially laminated in this order. Conductive layers 40a, 40b, 40c are formed, as P-side electrodes of laser 10, on contact layer 38 to be electrically isolated from each other. These electrodes are located correspondingly to regions A1, A2, A3 in QWS section 20. An N-type electrode layer 42 is formed on the bottom surface of substrate 12. The method of fabricating the semiconductor laser is as follows. Firstly, as shown in FIG. 2A, the first order grating 14 is formed on the top surface of N-type InP substrate 12 by using a presently available beam-interference exposing technique. A period of grating 14 is 240 nm. InGaAsP waveguide layer 16 is then formed on substrate 12 to a predetermined thickness, for example, 50 nm. Layer 16 buries grating 14 thereunder and has a flat top surface.

Subsequently, as shown in FIG. 2A, InGaAs well layers (hatched) 21, 23, 27, 29 and InGaAsP barrier layers 22, 24, 26, 28 are alternately laminated one on another on the waveguide layer 16 with the etching-stopper layer 32 being sandwiched between barrier layers 24, 26. Well layers 21, 23, 27, 29 are uniform in thickness; each layer is 8 nm thick. Barrier layers 22, 24, 26, 28 are different in thickness as follows: the layer 22 is 10 nm thick, layers 24, 26 are 3 nm, and layer 28 is 10 nm. The thickness of etching-stopper layer 32 may be 5 nm. To fabricate these layers, the currently available metal organic chemical vapor deposition (MOCVD) technique may be employed. As the crystal growth conditions therefor, the ambient temperature was set at 610° C., the pressure was 200 Torr, and the total flow rate was 10 liters per minute. An InP layer 34a is formed on the uppermost well layer 29.

Figure 2B:
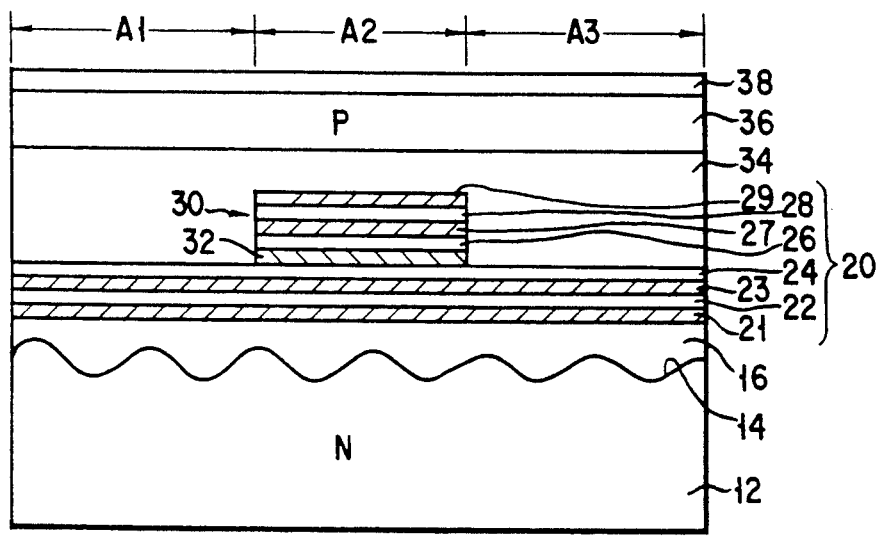

Then, the upper section of the resultant multiple quantum well structure (QWS) section 20, which includes the layers 26, 27, 28, 29 stacked on the etching-stopper layer 32, is subjected to a local etching process. In this etching process, an etchant of mixture of sulfuric acid, hydrogen peroxide and water may be used. (The etching-stopper layer 32 is chemically stable from such a sulfuric type etchant, and is hardly etched by this etchant.) The stacked layers 26 to 29 are etched out in the regions A1, A3 (peripheral regions of the optical resonator), thus providing the protruding lamination 30 in the region A2 (central region of the resonator), as shown in FIG. 2B. The lower multi-layered section consisting of layers 21 to 24 is prevented from being etched by the presence of the overlying etching-stopper layer 32, which itself is etched as shown in FIG. 2B. As a result, the QWS section 20 is completed, where the lamination number of well/barrier layers in regions A1, A3 is different from that in region A2. Then, the InGaAsP optical waveguide layer 34 is formed to a thickness of 70 nm using the MOCVD method in such a manner that the protruding portion 30 is buried thereunder, and that the surface of layer 3 is flat. The active region of laser 10 of FIG. 1 is thus buried completely by waveguide layer 34. The P-type InP cladding layer 36 (2-micrometer thick) and P-type InGaAs contact layer 38 (0.5-micrometer thick) are formed on layer 34.

Thereafter, a lateral-direction optical confinement structure is formed in the resultant structure so as to cause the active region to have a stripe shape. Separation grooves are then formed on the both sides of the active region. Fe-doped semi-insulative InP is buried in the grooves using the MOCVD method. This lateral confinement structure is one of a variety of structures of the same function; another lateral confinement structure may be employed alternatively.

Figure 2C:
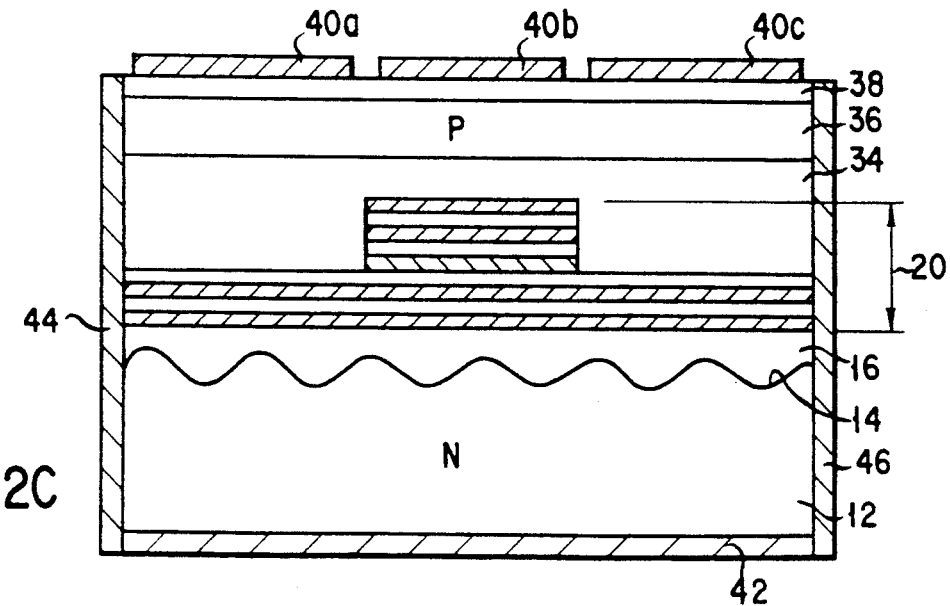
Figure 4:
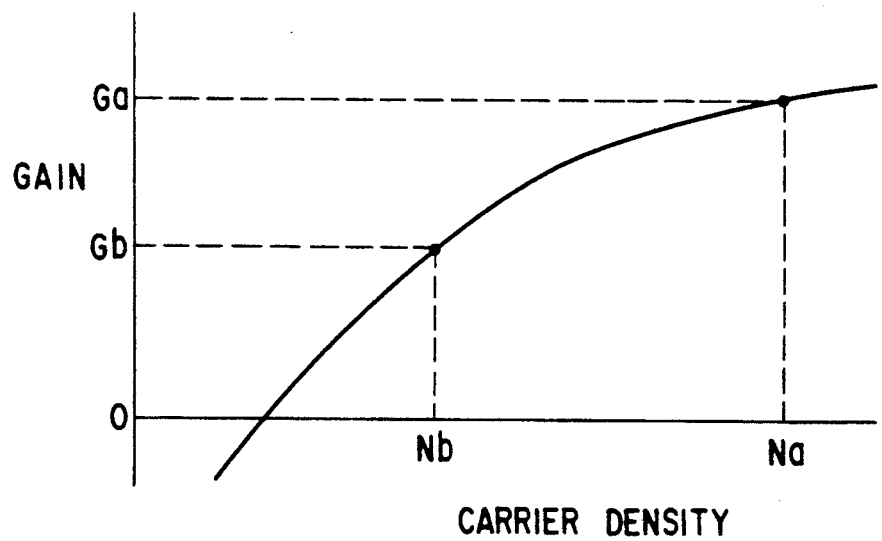
FIG. 4 is a graph showing the same of a known two-electrode quantum well structure DFB semiconductor laser as comparision.

Then, as shown in FIG. 2C, the electrically separated electrodes 40a, 40b, 40c are formed on the contact layer 38 such that the positions thereof correspond to regions A1, A2, A3, respectively. The N-side electrode layer 42 is formed o the bottom surface of substrate 12. Finally, anti-reflection (AR) coating layers 44, 46 are formed on the both facets of laser 10, by using the plasma CVD method for example.

With laser 10 of this embodiment, since the lamination number of well/barrier layers in the active (resonator's center) region A2 differs from those in the peripheral regions A1, A3, the differential gain at this part A2 of the active region varies along the longitudinal direction of the resonator. As is apparent from FIG. 3, the gain versus carrier density characteristic in the central active region A2, which is represented by a curve 50, differs from a characteristic curve 52 in the peripheral regions A1, A3. Assume that, when laser 10 is oscillating, the operating points are initially at Na1, Na2 in the characteristic curves 50, 52 of FIG. 3. While the total current is adjusted to cause the light output of laser 10 to be kept constant, a current in region A2 is increased, and current in regions A1, A3 is decreased. At this time, since region A2 is greater in differential gain than regions A1, A3, the increased amount of injection carrier in region A2 becomes more significant than the decreased amount of injection carrier in regions A1, A3. This results in that the operating points move at Nb1, Nb2 in the graph of FIG. 3. The averaged amount of carrier injection Nb(ave) can become less than that Na(ave) in the initial oscillation state. Therefore, the total equivalent refractive index increases, whereby the oscillation wavelength of laser 10 becomes longer. Under such a condition, since the Bragg wavelength itself varies with the mode position, it is possible to attain a broader wavelength-tunable range without any mode jump phenomenon and undesirable expansion of oscillation spectrum linewidth. This can enhance the tuning performance to the desired wavelength in optical communication systems.

The wavelength-tuning mechanism of the laser 10 will be discussed quantitatively as follows. Now discuss about the case wherein current carriers are uniformly injected into laser 10 in the initial state. Note here that if the optical intensity distribution is neglected, it may be considered that the distribution of refractive index becomes uniform. Then, only the carrier injecting amount ΔN2 in the central region A2 is increased while causing those in the remaining regions A1, A3 to be kept unchanged at a constant level. The resultant carrier density is changed between region A2 and regions A1, A3. Laser oscillation takes place if the gain and the loss are balanced when light travels for one round within the internal resonator of laser 10; therefore, the gain in regions A1, A3 is allowed to remain lowered correspondingly to the gain increase in region A2. In this case, variation of gain with respect to the carrier density is greater in the central region of the resonator, so that the oscillation can occur successfully even with less carrier density in the peripheral regions A1, A3. The total threshold carrier density of laser 10 can thus be decreased, as given as follows:

$$\Delta N1 + N2 + \Delta N3 < 0, \quad (1)$$

where N1 represents the carrier density in region A1, N2 and N3 represent those in regions A2, A3, respectively. Since the refractive index varies linearly with respect to the carrier density, the following relationship is obtained:
ti $\Delta n1 + \Delta n2 + \Delta n3 > 0,$ (2)
where n1 represents the refractive index in region A1, n2 and n3 represent those in regions A2, A3, respectively. This shows that variation occurs successfully in the total refractive index causing the oscillation frequency (wavelength) to change. In contrast, according to a conventional laser having its active region that is merely constant in the lamination number of well/barrier layers, the above expressions (1) and (2) are modified as follows:

$$\Delta N1 + \Delta N2 + \Delta N3 \sim 0, \quad (3)$$

$$\Delta n1 + \Delta n2 + \Delta n3 \sim 0. \quad (4)$$

The inventors prepared a sample of the laser 10 shown in FIG. 1, and measured its output characteristics. Currents of 100 mA in total were applied to the laser under the condition where the values of the currents flowing through the electrodes 40a, 40c were equal to each other, while the current flowing through the central electrode 40b was varied within the range from 10 to 90 mA. With such current variation, it was demonstrated that the threshold carrier density could be varied or changed significantly, and that the resulting wavelength changeable range was broadened up to 10 nm. In addition, the linewidth under tuning at the changed frequency was 750 kHz, which proves that this laser is superior in coherency to the conventional lasers.

Another wavelength-tunable DFB strained quantum well semiconductor laser 60 is shown in FIG. 5, wherein the laser 60 is featured in that the amount of deformation in the crystal alignment of its active region having a quantum well structure is locally varied to accomplish specific differential gains being different spatially or regionally. Laser 60 is similar to the laser 10 of FIG. 1 except for the following arrangements: The quantum-well structure (QWS) section (active region) 20 consists of an alternate lamination of InGaAsP barrier layers 22, 24, and InGaAs well layers (hatched) 71, 73, 75; in each layer 71, 73, 75, the deformation factor in central region A2 differs from those in peripheral regions A1, A3. With this embodiment, only the InGaAs layers have a compressive strain of 1% in region A2. In FIG. 5 the hatching pitch in region A2 is narrowed only for the purpose of visually emphasizing the difference in the amount of the crystal deformation. With the FIG. 5 embodiment, the measurements of the output characteristics under the same condition as in the FIG. 1 embodiment yielded excellent results with a wavelength tuning range being broadened up to 12 nm and the undesirable widening of the linewidth being suppressed to 500 kHz or less.

The laser 60 of FIG. 5 can be fabricated using the existing fabrication technique(s), and the manufacturing process thereof is similar to that shown in FIG. 2A, 2B and 2C This fabrication, however, requires the following steps in order to locally increase the amount of crystal deformation in InGaAs well layers 71, 73, 75 with respect to region A2. In forming the active layer section, after InGaAs layers 71, 73, 75 having a selected lattice constant are grown on the substrate 12, a certain portion corresponding to the resonator's central region A2 is selectively etched out using an ordinary lithography technique, thereby to define peripheral active regions having a quantum-well structure. A strained quantum-well structure (closely hatched in FIG. 5) is then formed in the etched region A2 with 1%-compressive strain being applied to a 4 nm-thick InGaAs well.

The invention is not limited to the above embodiments and may be practiced or embodied in still other ways without departing from the spirit or essential character thereof. While the embodiments use InGaAsP-/InP base materials for the active region and etching-stopper layer 32, other semiconductor materials that are applicable to optical devices, such as InGaAlP/GaAs InGaAsSb/GaSb and AlGaAsSb/GaSb, may also be used. In reduction to practice, the structures of FIGS. 1 and 5 are combinable. In the FIG. 1 embodiment it will be effective to reduce the optical loss resulting from the reflection within the active layer by designing the interface between the side wall of protruding portion 30 and waveguide layer 34 to have a stepped or tapered structure. This invention is also applicable to a semiconductor laser with a quantum narrow-line structure and a semiconductor laser with a quantum box structure.

Additionally, the previously described embodiments are arranged so that the differential gain in central region A2 of the active region is arranged to be greater; alternatively, the embodiments may be modified so that the gain in the peripheral regions A1, A3 may be greater. The number of multiple electrodes may be more than three, if required. In such a case, a corresponding number of gain-different regions are formed in the active region. Regarding the manufacturing method of the FIG. 5 embodiment, either a MOCVD method or MBE method using a selection mask may also be employed. If this is the case, it will be possible to form two different regions at a time by performing only on crystal growth process.

What is claimed is:

1. A wavelength-tunable distributed-feedback semiconductor laser comprising:
   a semiconductor substrate;
   an optical waveguide layer above said substrate;
   a multiple quantum well structure section above said optical waveguide layer including first and second semiconductor layers which are alternatively laminated on each other, said multiple quantum well structure section changing regionally in at least one of the number of laminated layers of the first and second layers, the amount of crystal deformation and the impurity doping dose, thereby defining a series of active regions having different differential gains; and
   a plurality of electrodes arranged above said multiple quantum well structure section to positionally correspond to said active regions.

2. A laser according to claim 1, wherein said multiple quantum well structure section has a differential gain substantially in a central region which is greater than those in two adjoining peripheral regions.

3. A laser according to claim 2, wherein said electrodes include three isolated electrodes for selectively injecting current carriers at different carrier densities into said central region and said peripheral regions.

4. A laser according to claim 3, wherein said substrate has a top surface above which a diffraction grating pattern is formed.

5. A laser according to claim 3, further comprising an etching-stopper layer arranged in said multiple quantum well structure section, for determining a reduced number of laminated layers of said first and second layers in said peripheral regions.

6. A laser according to claim 5, wherein said multiple quantum well structure section has a protruding portion in said central region, which is mounted on said etching-stopper layer.

7. A laser according to claim 4, wherein said active regions have one of a quantum well structure, a quantum narrow-line structure and a quantum box structure.

* * * * *